United States Patent [19]

Zibert et al.

[11] 4,130,895
[45] Dec. 19, 1978

[54] STORAGE MODULE

[75] Inventors: Klaus Zibert, Hohenschäftlarn; Paul W. Von Basse, Wolfratshausen, both of Germany

[73] Assignee: Siemens Aktiengesellschaft, Berlin & Munich, Germany

[21] Appl. No.: 806,586

[22] Filed: Jun. 15, 1977

[30] Foreign Application Priority Data

Jul. 26, 1976 [DE] Fed. Rep. of Germany ....... 2633558

[51] Int. Cl.² .............................................. G11C 11/40
[52] U.S. Cl. ..................................... 365/202; 307/238
[58] Field of Search ..... 340/173 R, 173 CA, 173 BB; 307/238, 279; 365/149, 154, 202, 210

[56] References Cited
U.S. PATENT DOCUMENTS 4,027,294  5/1977  Meusburger ................... 340/173 SF Primary Examiner—Terrell W. Fears
Attorney, Agent, or Firm—Hill, Gross, Simpson, Van Santen, Steadman, Chiara & Simpson

[57] ABSTRACT

A storage module has storage cells which are arranged between word lines and bit lines and which contain a storage capacitor and a cell selector transistor. Each bit line is divided into two bit line portions with a read-out amplifier connected to each bit line portion. In each bit line portion there is arranged a compensation cell which contains a selector transistor connected to the bit line portion and a capacitor is connected between an operating voltage and the selector transistor. Prior to a read-out process, the connection point between the capacitor and the selector transistor of the compensation cell is charged to a different operating voltage such that, at the beginning of the read-out process, the bit portion is set to a middle voltage located in the middle between the potential assigned to a binary "1" and the potential assigned to a binary "0". The capacitance of the selector transistor and the capacitor of the compensation cell are selected to be such that the increase in capacitance which occurs on the bit line portion as a result of the selection of the selector transistor and which is produced by the sum of the capacitances of the capacitor and of the selector transistor is equal to the increase in capacitance which occurs on the other bit line portion as a result of the selection of a storage cell.

3 Claims, 4 Drawing Figures

STORAGE MODULE

BACKGROUND OF THE INVENTION

1. Field of the Invention

This invention relates to a storage module having storage cells which are arranged between word lines and bit lines and which contain a storage capacitor and a cell selector transistor, and more particularly to such a storage module in which each bit line is divided into two bit line portions by the insertion of a readout amplifier, and each bit line portion has a compensation cell arranged therein which comprises a selector transistor connected to the bit line portion and a capacitor arranged between an operating voltage and the selector transistor, wherein prior to a read-out process the connection point between the capacitor and the selector transistor of the compensation cell is charged to a different operating voltage so that at the beginning of the read-out process the bit line portion is set to a middle voltage located in the middle of the potential assigned to a binary "1" and the potential assigned to a binary "0".

2. Description of the Prior Art

Storage modules in which storage cells having transistors connected between the word lines and bit lines are well known in the art. An example of such a construction is given in the publication "Electronics", Sept. 13, 1973, Pages 116–121. In these cell fields, a storage cell is, in each case, arranged at the intersections between a word line and a bit line. A storage cell can comprise, for example, a MOS transistor, hereinafter called the cell selector transistor, and a storage capacitor. Here, the control electrode of the cell selector transistor is connected to a word line, whereas one electrode of the controlled path of the cell selector transistor is connected to a bit line and the other electrode of the controlled path is connected to the storage capacitor.

FIG. 1 illustrates a construction of a known storage field of the type mentioned above in which only one bit line and several word lines have been represented. The word lines are referenced W, whereas the bit line is referenced B. A storage cell SZ is located, in each case, at the intersection points between the word lines W and the bit line B. The storage cell comprises a MOS transistor MS, the cell selector transistor, and a storage capacitor CS. The entire cell field is divided into two zones X1 and X2. This division is effected in that each bit line B is divided into two portions BL and BR, a read-out amplifier LV being connected between these two portions of the bit line. Thus, a read-out amplifier space is formed between the two cell zones X1 and X2. The read-out amplifiers can be constructed, for example, as pulsed flip-flops, as described in the above-mentioned publication.

If the storage cells SZ comprise single transistor storage cells, the read-out signals which occur during the read-out process of the storage cell are extremely small. If storage cells which are connected to a word line are selected, and thus the control inputs of the transistors MS which are connected to the word line are supplied with a signal which renders the transistors conductive, then as a result of the capacitive coupling between the word lines and the bit lines, interference signals are coupled over to the bit lines. These interference signals are superimposed upon the read-out signals in such a way as to often prevent analysis of the read-out signals. For this reason, compensation cells (dummy cells) are provided and serve to compensate the interference signals which are coupled to the bit lines as a result of the selection of a word line. A compensation cell LZ of this type is arranged on each side of the read-out amplifier LV in each bit line portion. The compensation cell, like the storage cell SZ, in each case comprises a transistor MD, hereinafter called the compensation selector transistor, and a capacitor CD.

The compensation cells serve to compensate the interferences which are coupled to the bit lines as a result of the selection of the word line. Here, one proceeds as follows. Prior to the call-up of a word line of the cell field, the capacitors CD of the compensation cells are charged by a generator G to a voltage which lies in the middle between the potential which defines a binary "0" and the potential which defines a binary "1". This voltage is referred to as the middle voltage. On the call-up of a word line, the compensation cells arranged in the other cell zone are in each case called up. If, for example, the word line W1 is operated, the compensation cells LZ located in the cell zone are likewise operated by a signal on the line WDR. As a result of the selection of the word line W1, interferences arise on the bit line portion BL and as a result of the selection of the line WDR, interferences arise on the bit line portion BR. These interferences are fed to the read-amplifier LV and can in this matter be compensated. The same holds true when the word line WN is operated, in which case the line WDL is simultaneously selected.

If, in the known arrangement illustrated in FIG. 1, the compensation selector transistor is dimensioned in accordance with the cell selector transistor of the storage cell, and the compensation capacitor is dimensioned in accordance with the storage capacitor of the storage cell, the increase in capacitance on each bit line portion will be equal on the selection of a compensation cell and a storage cell. With the aid of the generator G, the capacitor of the compensation cell is connected to a voltage which corresponds to the middle voltage on the bit line portion. The disadvantage of this known arrangement resides in the fact that an additional generator G is required to produce the middle voltage on the bit line portion. This generator must be able to compensate component fluctuations, temperature fluctuations and supply voltage fluctuations. This requires a corresponding expense in the construction of the generator G.

For this reason, it has been proposed that the generator G in FIG. 1 be omitted and that the connection point between the compensation selector transistor MD and the capacitor CD of each compensation cell be connected to an operating voltage prevailing on the storage module. If, for example, the capacitors of the storage cells and of the compensation cells are connected to an operating voltage VDD, the connection point between the compensation selector transistor MD and the capacitor CD of the compensation cell can be connected to a different operating potential VSS prior to the initiation of the read-out process. By means of an appropriate selection of the capacitance of the capacitor CD, it is possible to again set up a middle voltage located between the "1" and the "0" voltages of the read-out signals on the bit line portion. If, for example, the voltage VDD corresponds approximately to the voltage which defines a binary "1" and the potential VSS corresponds approximately to the voltage which defines a binary "0", the capacitance CD of the compensation cell can be selected to be equal to half the capacitance of the storage capacitor CS. However, this proposal has the disadvantage that the increase in capacitance which occurs on the selection of a storage cell and a compensation cell on the assigned bit line portions differs, as a result of which the sensitivity of the arrangement is considerably reduced.

SUMMARY OF THE INVENTION

The object of the present invention is to provide an improved compensation cell of a storage module so that the capacitors of the compensation cells can be pre-charged to an operating voltage, and nevertheless the increase in capacitance on a bit line portion which occurs on the selection of a compensation cell corresponds to the increase in capacitance on the other bit line portion which occurs as a result of the selection of a storage cell.

This object is realized in that the capacitance of the compensation selector transistor and of the capacitor of the compensation cell is selected to be such that the increase in capacitance which occurs on the selection of the selector transistor on the bit line portion, and which is produced by the sum of the capacitances of the capacitor and of the selector transistor is equal to the increase in capacitance which occurs as a result of the selection of a storge cell on the other bit line portion.

In the event of the selection of a storage cell, the capacitance of the bit line portion is always increased by the parallel connection of the storage capacitor and the storage cell selector transistor. The same also applies to the compensaton cells. Here again, the capacitance of the compensation selector transistor and of the capacitor of the compensation cell affect the bit line portion on the selection of the compensation cell. If the increase in capacitance on a bit line portion produced by the compensation cell and the storage cell is in each case to be equal, it is not necessary to dimension the capacitors in the compensation cell and the storage cell in the same manner, but is in fact sufficient for the sum of the input capacitance of the storage cell selector transistor and of the capacitance of the storage capacitor to possess the same value as the sum of the input capacitance of the compensation selector transistor and the capacitance of the compensating capacitor of the compensation cell. In this manner it is possible to select the value of the capacitances of the compensation selector transistor and of the compensation capacitor to be such that the sum of these capacitances is equal to the sum of the capacitances of the cell selector transistor and of the storage capacitor, and that the individual values no longer correspond to those of the storage cell. Then it is also possible to select the capacitances of the compensation cell to be such that, in spite of the pre-charging of the capacitor to an operating voltage on the bit line portion, the middle voltage can be produced during the read-out process. For this purpose, the capacitance of the capacitor of the compensation cell is reduced relative to the capacitance of the storage capacitor, and the capacitance of the selector transistor of the compensation cell is increased correspondingly relative to the capacitance of the cell selector transistor of the storage cell.

It is expedient and advantageous to select the value of the capacitance of the capacitor of the compensation cell to be such that it amounts to a value in the range of 25%–75% of the capacitance of the storage capacitor of the storage cell, and, correspondingly, to select the capacitance of the selector transistor of the compensation cell to be such that its value is in a range of 25%–75% greater than the capacitance of the cell selector transistor of the storage cell. These ranges for the capacitance values are necessary since, in practice, additional parasitic capacitances influence the middle voltage.

If the compensation selector transistor and the capacitor of the compensation cell are constructed in an integrated module, the values of the capacitances thereof can be governed by the selection of the gate electrode of the compensation selector transistor and the electrode of the capacitor, which is designed as a varactor.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
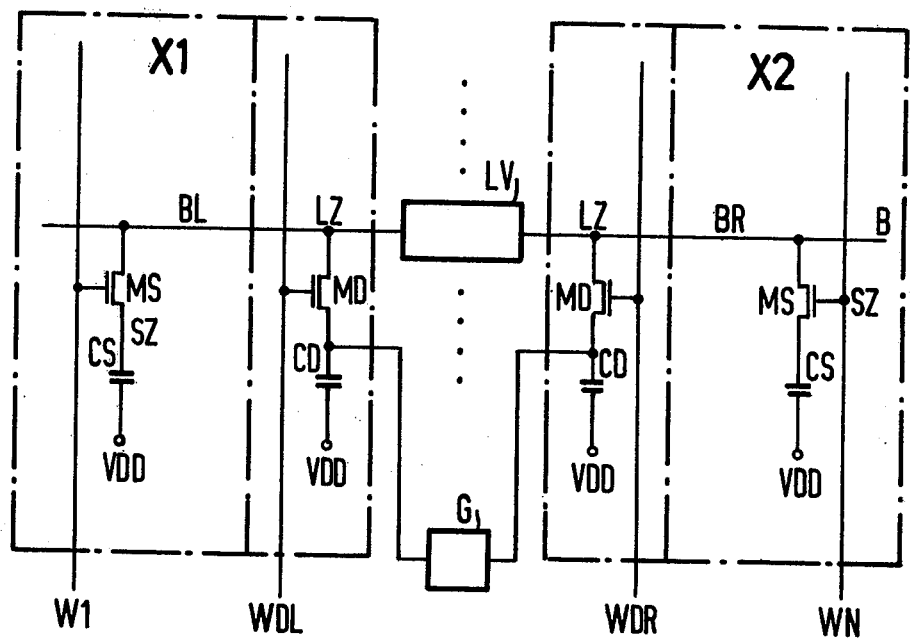
FIG. 1 is a schematic representation of the construction of a storage field which is known in the art.

The apparatus of FIG. 1 has already been discussed above in connection with the prior art and will not be discussed in detail here.

Figure 2:
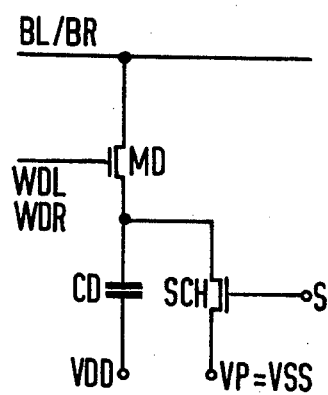
FIG. 2 is a schematic circuit diagram of a compensation cell constructed in accordance with the present invention.

FIG. 2 illustrates a circuit for a compensation cell which comprises a compensation selector transistor MD and a compensation capacitor CD. A switch SCH is provided to pre-charge the capacitor CD.

The compensation selector transistor MD is connected by its controlled path to an appertaining bit line portion BL, BR and the capacitor CD, and has its control input (gate) connected to an appertaining word line WDL, WDR. The capacitor CD is also connected to a fixed operating voltage VDD. The capacitor CD is pre-charged in that the switch SCH is switched on by the application of a signal S to its control input, and thus a different operating voltage $VP = VSS$ is connected to the capacitor CD, and the connection point between the compensation selector transistor MD and the capacitor CD is charged to the voltage VP. The capacitance of the capacitor CD and the input capacitance of the compensation selector transistor MD are selected to be such that their sum is equal to the sum of the capacitances of the storage cell selector transistor MS and the storage capacitor CS. This ensures that on the selection of the compensation cell, the increase in capacitance on the bit line portion connected to the compensation cell is equal to the increase in capacitance on the selection of a storage cell on the bit line portion connected to this storage cell.

When the capacitor CD is pre-charged to an operating voltage $VP = VSS$, the middle voltage on the bit line portion can be set in that the capacitance of the capacitor CD is selected accordingly. In theory this capacitance would have to be equal to half the capacitance of the storage capacitor of the storage cell. However, as pointed out above, this produces a change in the overall capacitance of the compensation cell which affects the bit line portion, the input capacitance of the compensation selector transistor must also be altered simultaneously, i.e. it must be increased. In theory, this capacitance would have to be equal to the capacitance of the cell selector transistor of the storage cell plus half the capacitance of the storage capacitor. Since, in practice, additional parasitic capacitances influence the middle voltage, the actual values of the capacitance of the compensation capacitor CD and of the compensation selector transistor MD fluctuate about the theoretical values. Here, it has proved that the value of the compensation capacitor CD lies between 25% and 75% of the value of the capacitance of the storage capacitor, whereas the value of the capacitance of the compensation selector transistor MD is between 25% and 75% greater than the capacitance of the cell selector transistor. In any case, by an appropriate selection of the capacitance values of the capacitor CD and of the selector transistor MD, it is possible to ensure that in spite of the pre-charging of the capacitor CD to the operating voltage $VP = VSS$, on the operation of the selector transistor a middle voltage located in the middle of the range between the "1" voltage and the "0" voltage is produced on the bit line portion.

Figure 3:
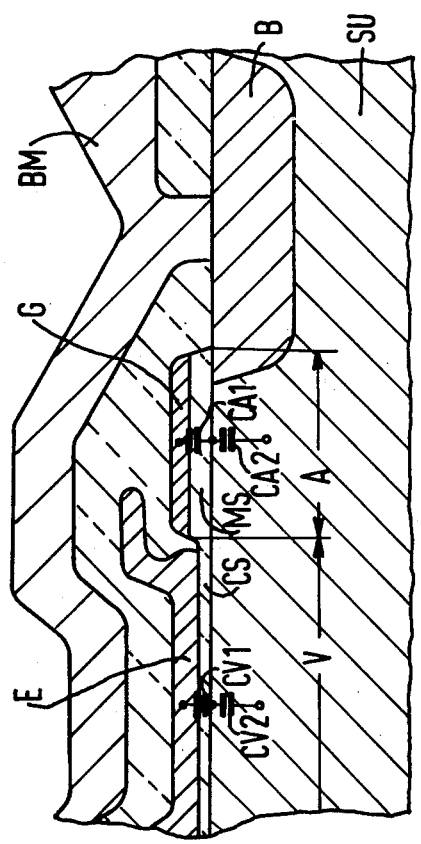
FIG. 3 is a cross-sectional view through a storage cell constructed in the double silicon gate technique.

Referring to FIG. 3, a cross-sectional view through a storage cell is illustrated, wherein the storage cell is constructed in the double silicon gate technique. A bit line B is diffused into a semiconductor substrate SU in the region of the storage cell. The connection to that zone of the bit line which is diffused into the substrate SU is effected, e.g. with a metal line BM which extends above the substrate. The control electrode G of the cell selector transistor MS is arranged adjacent the bit line B, partially overlapping the latter, above and insulated from the substrate SU. Here, the control electrode G is located in the word line W. Next to the control electrode G, and partially overlapping the latter, a further electrode E is arranged, with the aid of which the storage capacitor CS is formed. The electrode E is likewise insulated from the semiconductor substrate SU. In addition, an insulating layer is located between the control electrode G, the electrode E and the metal line BM.

The length of the selector transistor, which fundamentally corresponds to the length of the control electrode G, is referenced A. The length of the storage capacitor, which is designed as a varactor, is referenced V. The capacitance components from which the capacitances of the cell selector transistor and the storage capacitor are composed can also be seen in FIG. 3. The capacitance of the cell selector transistor comprises the component CA1, which is effective between the control electrode G and the surface of the semiconductor substrate SU, and the component CA2, which is effective between the surface of the semiconductor substrate SU and the substrate itself. Correspondingly, the capacitance of the storage capacitor comprises the components CV1 and CV2 which are effective, respectively, between the electrode E and the surface of the substrate SU and between the surface of the substrate SU and the substrate itself.

Figure 4:
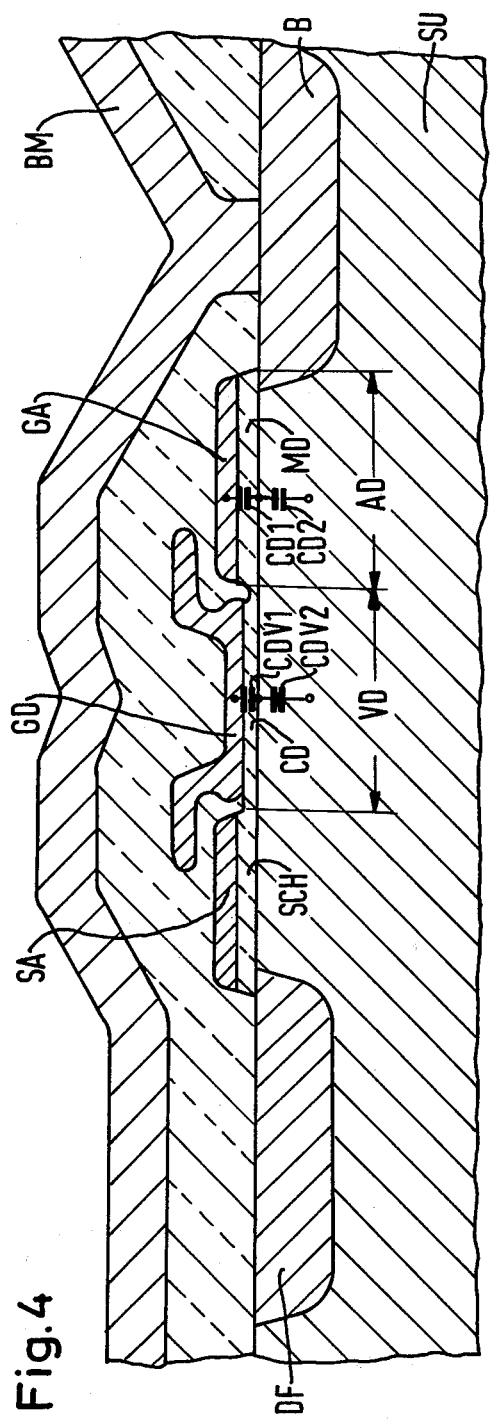
FIG. 4 is a cross-sectional view through a compensation cell constructed in the double silicon gate technique.

Referring to FIG. 4, the construction of the compensation cell in the double silicon technique is illustrated in cross-sectional form. This construction basically corresponds to the construction of the storage cell. The only difference resides in the fact that the switch SCH has been added for the pre-charging of the capacitor of the compensation cell. Here too, the bit line B is diffused partially into the semiconductor substrate SU, and the connection is effected by way of the metal line BM. The compensation selector transistor MD is arranged adjacent the bit line B in the semiconductor substrate SU, and for this purpose a control electrode GA is arranged in insulated fashion above the semiconductor substrate SU. The width of the control electrode GA is illustrated at AD. The capacitor CD, which is likewise designed as a varactor, is located adjacent the selector transistor. For this purpose, an electrode GD is arranged so as to insulate it from the semiconductor substrate SU. The electrode GD has a width of VD. A switch SCH, which is located next to the capacitor, is provided for pre-charging the capacitor. For this purpose, an electrode SA is arranged above the semiconductor substrate and insulated therefrom. Finally, adjacent the electrode SA in the semiconductor substrate SU there is provided a diffusion zone DF through which the operating voltage VSS is supplied. The capacitance of the compensation selector transistor MD comprises the components CD1 and CD2, whereas the capacitance of the capacitor comprises the components CDV1 and CDV2. These capacitances are effective, as illustrated, and as discussed above with respect to the storage cell.

It is known in the art to design transistors and capacitors in the double silicon technique. Here, we are only concerned with indicating how, by changing the length of the selector transistor and the capacitor of the compensation cell, while maintaining a uniform width, it is possible to set the capacitance values of the selector transistor and the capacitor. In the compensation cell, the length VD is shortened relative to the length V in the storage cell, and a length AD of the compensation selector transistor is increased relative to the length A of the of the cell selector transistor. The overall length AD + VD must, in a first approximation, be equal to the overall length V + A. As a result, the loading of the read-out amplifier is not changed, whereas on the other hand the middle voltage can be set up on the bit line portion. As can be seen from FIGS. 3 and 4, it is an easy task to select the capacitance values for the capacitor and the transistor of the compensation cells to be such that the loading of the bit line portions by the compensation cells is equal to the loading of the bit line portions by the storage cells, and in addition the middle voltage can be set up on the bit line portions.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A storage module comprising
   a plurality of bit lines each divided into two bit line portions,
   a plurality of word lines arranged intersecting said bit line portions,
   a pair of compensation word lines each intersecting one bit line portion of each of said bit lines,
   a plurality of storage cell, each of said storage cells including a cell selector transistor having a controlled conduction path and a control electrode connected to a word line, and a storage capacitor connected in series with said controlled path between a bit line portion and a supply potential, a plurality of compensation cells, each of said compensation cells including a compensation cell selector transistor having a controlled path and a control electrode connected to a compensation word line, and a compensation capacitance connected in series with said controlled path between the respective bit line portion and the supply potential, means connected to the junctions of each of said compensation cell selector transistors and its serially connected compensation capacitance and operable prior to reading to apply a fixed operating potential thereto and place said bit line portions at a predetermined potential which is between the potential defining a binary "1" and the potential defining a binary "0", each of said compensation cell selector transistors including a capacitance which together with said compensation cell capacitance is equal to a capacitance increase experienced by the opposite bit line portion upon selection of a storage cell.

2. The storage module of claim 1, wherein:

said compensation cell includes a capacitance which is in the range of 25%-75% of the capacitance of said storage capacitor, and said compensation transistor includes a capacitance which is greater than the capacitance of said storage cell selector transistor by an amount in the range of 25%-75%.

3. The storage module of claim 2, wherein the capacitance of said compensation cell selector transistor and of said compensation cell capacitance are governed by the area of said control electrode of said compensation cell selector transistor and said compensation cell capacitance.

* * * * *